(12) United States Patent
Yang

(10) Patent No.: US 8,772,935 B2
(45) Date of Patent: Jul. 8, 2014

(54) SEMICONDUCTOR DEVICE AND METHOD OF MANUFACTURING THE SAME

(75) Inventor: Young Ho Yang, Chungcheongbuk-do (KR)

(73) Assignee: SK Hynix Inc., Gyeonggi-so (KR)

( * ) Notice: Subject to any disclaimer, the term of this patent is extended or adjusted under 35 U.S.C. 154(b) by 59 days.

(21) Appl. No.: 13/598,156

(22) Filed: Aug. 29, 2012

(65) Prior Publication Data

US 2013/0234259 A1 Sep. 12, 2013

(30) Foreign Application Priority Data

Mar. 6, 2012 (KR) .................. 10-2012-0022785

(51) Int. Cl.
*H01L 29/40* (2006.01)
*H01L 23/52* (2006.01)
*H01L 23/48* (2006.01)

(52) U.S. Cl.
USPC ............. 257/751; 257/E21.584; 257/758; 257/774; 438/627; 438/643; 438/927

(58) Field of Classification Search
CPC ................................................ H01L 21/76843
USPC .............. 257/E21.021, E21.584, E21.585, 257/E23.011, E23.145, 401, 751, 758, 774; 438/618, 627, 643, 653, 673, 927
See application file for complete search history.

(56) References Cited

U.S. PATENT DOCUMENTS

| | | | | | |
|---|---|---|---|---|---|
| 4,962,414 | A | * | 10/1990 | Liou et al. ................ | 257/740 |
| 6,147,402 | A | * | 11/2000 | Joshi et al. ............... | 257/751 |
| 6,544,840 | B2 | * | 4/2003 | Sukekawa et al. ........ | 438/253 |
| 6,680,247 | B2 | * | 1/2004 | Ueno ....................... | 438/637 |
| 6,713,388 | B2 | * | 3/2004 | Tseng et al. .............. | 438/673 |
| 7,163,886 | B2 | * | 1/2007 | Fujiwara et al. .......... | 438/622 |
| 7,320,935 | B2 | * | 1/2008 | Leu et al. ................. | 438/636 |
| 7,473,630 | B2 | * | 1/2009 | Usami et al. ............. | 438/618 |
| 7,732,314 | B1 | * | 6/2010 | Danek et al. ............. | 438/584 |
| 7,973,416 | B2 | * | 7/2011 | Chauhan ................... | 257/777 |

FOREIGN PATENT DOCUMENTS

KR 1020090044909 5/2009

* cited by examiner

*Primary Examiner* — Chris Chu
(74) *Attorney, Agent, or Firm* — IP & T Group LLP

(57) ABSTRACT

A semiconductor device and method where a side wall insulating layer, extending perpendicular from a top surface of a semiconductor substrate, is prevented from contacting the semiconductor substrate by a barrier layer formed at an interface between the semiconductor substrate and the insulating layer.

21 Claims, 4 Drawing Sheets

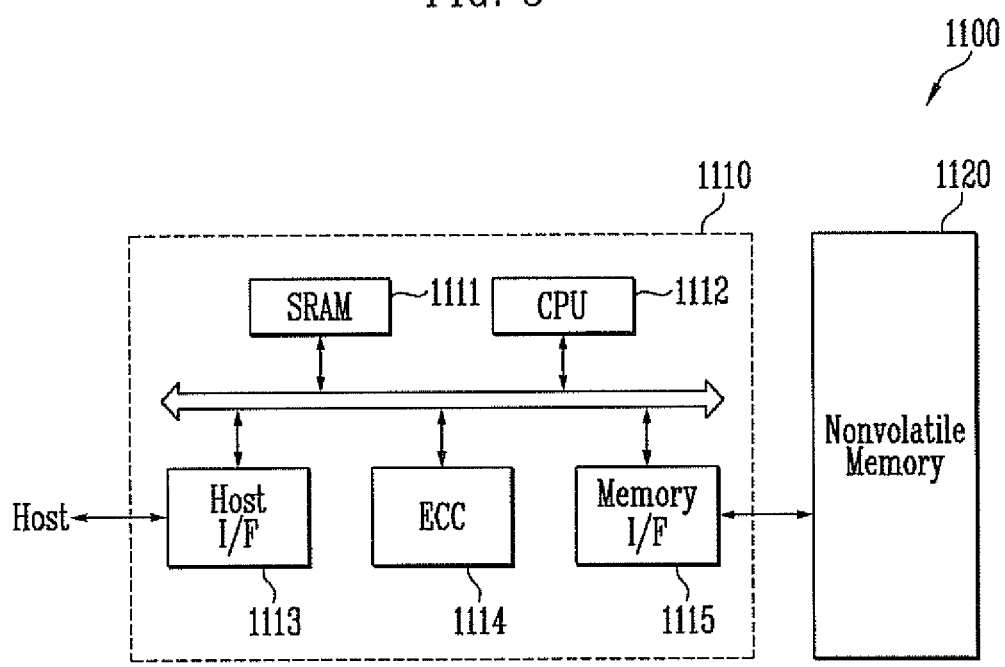

SEMICONDUCTOR DEVICE AND METHOD OF MANUFACTURING THE SAME

CROSS-REFERENCE TO RELATED APPLICATION

Priority is claimed to Korean patent application number 10-2012-0022785, filed on Mar. 6, 2012, the entire disclosure of which is incorporated by reference herein.

BACKGROUND

The present invention relates to a semiconductor device and a method of manufacturing the semiconductor device, and more particularly to a semiconductor device having improved reliability and a method of manufacturing the semiconductor device.

Patterns included in a semiconductor device may be formed by etching an insulating layer to form a recess region and filling the recess region with a conductive layer. In this case, the insulating layer may have a thickness sufficient to fill spaces between lower patterns formed on a semiconductor substrate. However, if a distance between the lower patterns is to small for the high-integration of the semiconductor device, then a void may be generated within the insulating layer filled in the spaces between the lower patterns. The void may cause defects in the semiconductor device.

Hereinafter, a problem in the conventional art will be described in more detail, using, as an example, a process of forming a plurality of contact plugs that are spaced apart from each other.

In order to form the plurality of contact plugs, an insulating layer is formed on a semiconductor substrate including a junction region and gate patterns. The gate patterns are formed on the semiconductor substrate. The junction region is formed within the semiconductor substrate between the gate patterns. The insulating layer has a thickness sufficient to fill spaces between the gate patterns, so as to cover the gate patterns.

Subsequently, a plurality of contact holes are formed by etching the insulating layer between the gate patterns so that the contact holes may be spaced apart. The junction regions are exposed through the contact holes. The contact holes may be etched a direction perpendicular to an upper surface of the semiconductor substrate. When a void exists within the insulating layer, a connection problem may be generated between the adjacent contact holes due to the void. Accordingly, when the contact plugs are formed by filling the contact holes with a conductive layer, in a subsequent process, the void will also filled with the conductive layer. Thus, a physical or electrical connection problem between the adjacent contact plugs may result.

In order to correct the aforementioned concerns, various methods have been proposed. However these proposed methods may cause additional concerns, so that reliability of a semiconductor device using these methods may be deteriorated.

SUMMARY

The present disclosure has been made in an effort to provide a semiconductor device capable of improving reliability and a method of manufacturing the semiconductor device.

An exemplary embodiment of the present disclosure provides a semiconductor device including: an interlayer insulating layer formed on a semiconductor substrate; a conductive layer pattern passing through the interlayer insulating layer to contact the semiconductor substrate; a side wall insulating layer covering a surface of the conductive layer pattern; and a barrier layer formed at an interface between the semiconductor substrate and the side wall insulating layer.

Another exemplary embodiment of the present disclosure provides a method of manufacturing a semiconductor device, including: forming an interlayer insulating layer on a semiconductor substrate; forming a recess region exposing a surface of the semiconductor substrate by etching the interlayer insulating layer; forming a barrier layer covering the exposed surface of the semiconductor substrate; forming a side wall insulating layer covering a surface of the recess region including the barrier layer; etching the side wall insulating layer and the barrier layer to expose the semiconductor substrate; and forming a conductive layer pattern in the recess region, the conductive layer pattern contacting the semiconductor substrate.

BRIEF DESCRIPTION OF THE DRAWINGS

FIG. 3 is a diagram illustrating a memory system according to an exemplary embodiment of the present invention.

DETAILED DESCRIPTION

Hereinafter, an exemplary embodiment of the present invention will be described with reference to the accompanying drawings in detail. However, the present invention is not limited to an embodiment disclosed below and may be implemented in various forms. The embodiment is provided only for illustrative purposes and for full understanding of the scope of the present invention by those skilled in the art, and the scope of the present invention will be understood by the claims of the present invention.

FIGS. 1A to 1J are cross-sectional views illustrating a semiconductor device and a method of manufacturing the semiconductor device according to a first embodiment of the present invention.

Figure 1A:
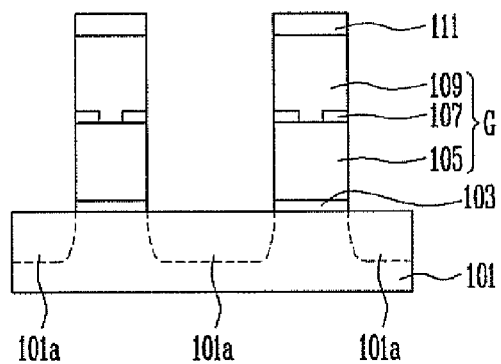
FIGS. 1A to 1J are cross-sectional views illustrating a semiconductor device and a method of manufacturing the semiconductor device according to a first embodiment of the present invention.

Referring to FIG. 1A, gate patterns G are formed on a semiconductor substrate 101, and first junction regions 101a are formed by injecting an impurity into the semiconductor substrate 101 between the gate patterns G. Hereinafter, a method of forming the gate patterns G and the first junction regions 101a will be described in more detail, with reference to an example.

For example, in a case of a NAND flash memory device, each of the gate patterns G includes a gate insulating layer 103 formed on the semiconductor substrate 101, a floating gate layer 105 formed on the gate insulating layer 103, a dielectric layer 107 formed on the floating gate layer 105, and a control gate layer 109 formed on the dielectric layer 107.

In order to form the gate patterns G, having the aforementioned stacked structure, the gate insulating layer 103 is first formed on the semiconductor substrate 101. The gate insulating layer 103 may be used as a tunnel insulating layer in a region in which a memory cell transistor is formed. For the convenience of description, a region in which a select transistor is formed is only illustrated. Then, the floating gate layer 105 is formed on the gate insulating layer 103. The floating gate layer 105 may be formed of a polysilicon layer.

Next, the floating gate layer 105 is etched using isolation masks, which define isolation regions, as an etch barrier. Accordingly, the floating gate layer 105 is patterned in a plurality of parallel line patterns.

Subsequently, trenches (not shown) are formed in a shape of parallel lines in the isolation regions by etching the gate insulating layer 103 and the semiconductor substrate 101. Then, the insulating layer is formed in such a manner that the trenches are filled with the insulating layer, and that portions of the insulating layer that are outside of the trenches are removed so that the insulating layer remains in the trenches and on the trenches. Accordingly, the isolation layers (not shown) are formed.

The dielectric layer 107 is formed on the floating gate layer 105 after removing the isolation masks. The dielectric layer 107 includes an oxide layer, a nitride layer, and an oxide layer. The oxide layer or the nitride layer may be replaced with an insulating layer having a higher dielectric constant higher than a dielectric constant of the oxide layer or the nitride layer. Portions of the dielectric layer 107 are etched in regions in which the gate patterns G of the select transistors are to be formed. Accordingly, the floating gate layer 105 is partially exposed in the regions in which the gate patterns G of the select transistors are to be formed.

Next, the control gate layer 109 is formed on the dielectric layer 107. The control gate layer 109 may be formed of a single layer, or of multiple layers, including at least one of a polysilicon layer, a metal layer, or a metal silicide layer.

Hard mask patterns 111 are formed on the control gate layer 109 in a direction crossing the isolation layers. Then, the control gate layer 109, the dielectric layer 107, and the floating gate layer 105 are etched using the hard mask patterns 111 as an etch barrier. In this case, the gate insulating layer 103 may be further etched. As a result, the gate patterns G are formed on the semiconductor substrate 101.

The first junction regions 101a are formed by injecting, to a predetermined depth, an impurity into the semiconductor substrate 101 between the gate patterns G.

Figure 1B:
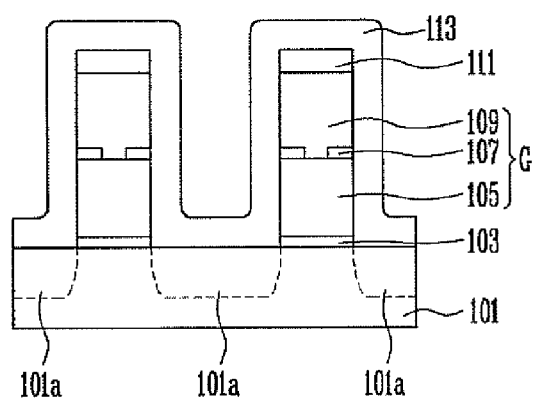

Referring to FIG. 1B, a spacer layer 113 is formed along a surface of the entire structure in which the gate pattern G is formed. The spacer layer 113 may be a layer formed to define a Lightly Doped Drain (LDD) region, and may be formed by depositing an oxide layer.

Figure 1C:
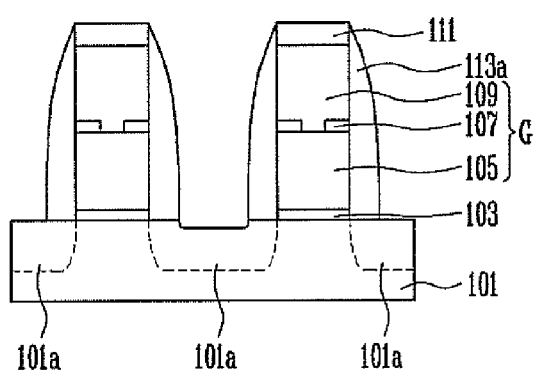

Referring to FIG. 1C, the spacer layer 113 is etched by an etching process, such as an etch-back process, so that the first junction regions 101a between the gate patterns G are exposed. In this case, the spacer layer 113 remains on a side wall of the gate pattern G as a spacer 113a. An additional impurity, having a higher concentration than that of the impurity previously injected into the first junction regions 101a, may be injected into the first junction regions 101a between the spacers 113a. The spacers 113a and the gate patterns G may serve as ion injection barriers. Accordingly, the first junction regions 101a, into which the impurity having the high concentration is not injected, may be defined as the LDD region.

Figure 1D:
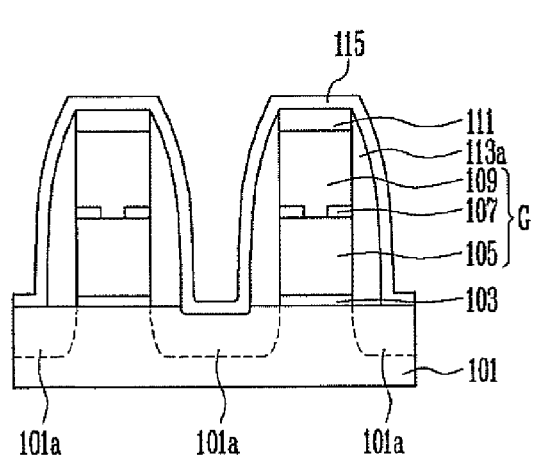

Referring to FIG. 1D, an etching stopping layer 115 may be formed along a surface defined by the spacers 113a, the hard mask patterns 111, and the first junction regions 101a. The etching stopping layer 115 may be formed of a nitride layer. The etching stopping layer 115 may function to prevent the gate pattern G from being exposed in a process of etching an interlayer insulating layer to be described later.

Figure 1E:
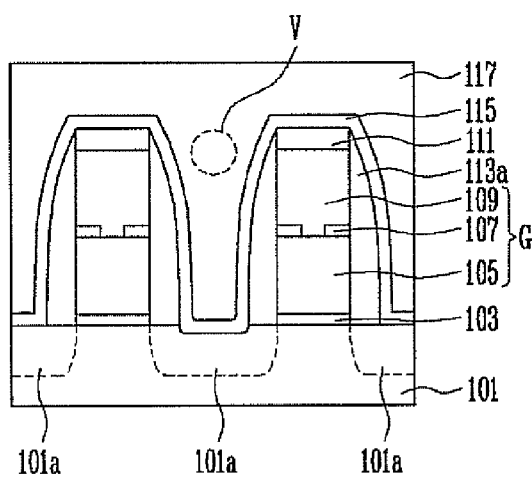

Referring to FIG. 1E, an interlayer insulating layer 117 is formed over the surface of the etching stopping layer 115 and has a thickness sufficient to fill a space between the gate patterns G. The interlayer insulating layer 117 may be formed on an oxide layer.

Figure 1F:
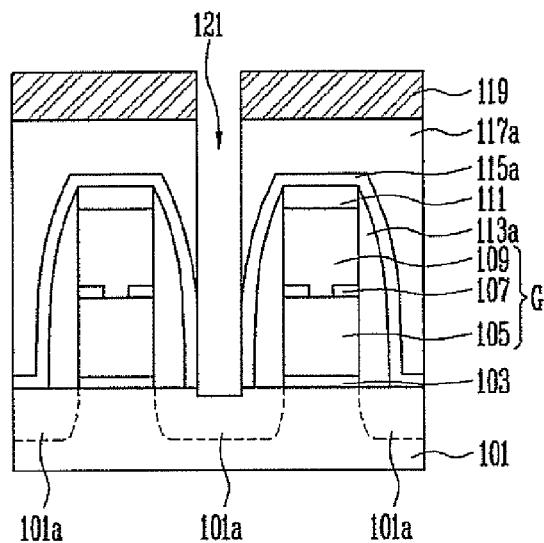

Referring to FIG. 1F, a hard mask pattern 119 is formed on portions of the interlayer insulating layer 117. Then, the interlayer insulating layer 117 and the etching stopping layer 115 are etched, using the hard mask pattern 119 as an etch barrier, to form a recess region 121 through which the semiconductor substrate 101 is exposed.

During the etching of the interlayer insulating layer 117, the etching stopping layer 115, which a great etch selectivity to the interlayer insulating layer 117, is not etched (or etched more slowly) by an etchant of the interlayer insulating layer 117. Therefore, the etching of the interlayer insulating layer 117 will expose the etching stopping layer 115, but will not expose the gate patterns G. The semiconductor substrate 101 will be exposed by etching the exposed etching stopping layer 115. In the exemplary embodiment, the semiconductor substrate 101 may be etched to a predetermined thickness.

Some of the first junction regions 101a of the semiconductor substrate 101 are exposed through the recess regions 121. The first junction regions 101a, exposed through the recess region 121, are formed between the gate patterns G of the select transistors to be sources or drains of the select transistors. The gate patterns G may be covered by portions of the interlayer insulating layer 117a and the etching stopping layer 115 that remain after the forming of the recess region 121. The hard mask pattern 119 may be removed after forming of the recess region 121.

Figure 1G:
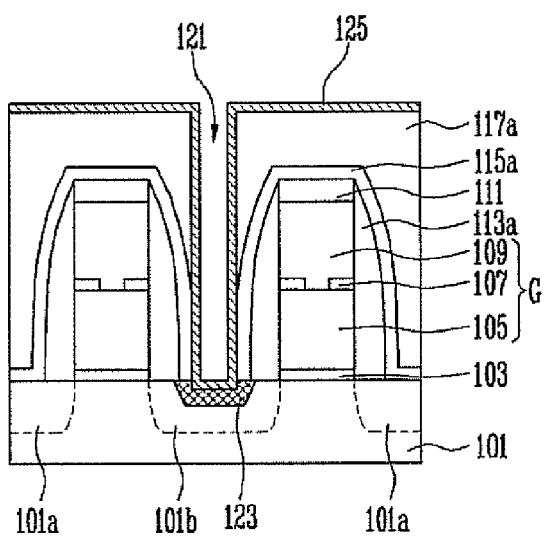

Referring to FIG. 1G, after the recess region 121 is formed, a first material layer 123 is formed on a surface of the semiconductor substrate 101 exposed through the recess region 121. The first material layer 123 may be an insulating layer capable of blocking a movement of charges, or a migration of the impurity, to a second material layer 125 (to be formed in a subsequent process), even if the second material layer 125 is formed of a material capable of charge trapping.

For example, the first material layer 123 may be an oxide layer formed by oxidizing the exposed region of the recess region 121 to a predetermined thickness in an atmosphere in which $O_2$ and $H_2$ are injected. In this example, the oxidization process may be performed by radical oxidization, Rapid Thermal Process (RTP) oxidization, wet oxidization, or dry oxidization.

Then, an additional impurity is injected into the first junction regions 101a, exposed through the recess region 121, by using the first material layer 123 as a buffer layer. Accordingly, a second junction region 101b may be formed. Resistance of the second junction region 101b, which is to be used as the source or the drain, may be reduced through the additional injected impurity. Furthermore, because the additional impurity, which forms the second junction region 101b, is injected with the first material layer 123 serving as the buffer layer, damage to the semiconductor substrate 101 may be reduced via the first material layer 123. Furthermore, because the first material layer 123 is formed by the oxidization process, any damaged area generated in the surface of the semiconductor substrate 101 during the process of forming the recess region 121 may be removed.

If a distance between the gate patterns G is formed to be small, a void V (shown FIG. 1E) may be formed in the interlayer insulating layer 117 between the gate patterns G during the forming the interlayer insulating layer 117. In this case, the void V may be opened during the process of forming the recess region 121 by etching the interlayer insulating layer 117. Therefore, adjacent recess regions 121 may be connected through the void V. In order to prevent multiple recess regions 121 from being connected through the void V, a second material layer 125 is formed along a surface of the recess region 121 and the surface of the semiconductor substrate 101. In this case, the second material layer 125 may be formed so as to partially fill the void V. Even though the void V is not completely filled with the second material layer 125, the second material layer 125 is formed along a side wall of the recess region 121, so that an opening of the void V may be blocked.

The second material layer 125 may be a side wall insulating layer and is capable of protecting the first material layer 123 during a process of etching the first material layer 123 to expose the second junction region 101b in the semiconductor substrate 101. For example, the second material layer 125 may be formed of a material having a great etch selectivity to the first material layer 123. Furthermore, the second material layer 125 may be formed of a material, which is not damaged by a cleaning solution used in a cleaning process. As the cleaning solution typically contains hydrofluoric acid (HF), the second material layer 125 may be formed of a nitride layer, such as silicon nitride (SiN), silicon oxynitride (SiON), or silicon carbon nitride (SiCN).

As described above, in the first embodiment of the present invention, the first material layer 123 is formed by oxidizing the semiconductor substrate 101, exposed through the recess region 121. Then the second material layer 125, which is a nitride layer is formed. Therefore, the second material layer 125 is surrounded by the first material layer 123, at a lower edge portion of the recess region 121, so that the second material layer 125 is prevented from being in direct contact with the semiconductor substrate 101. The first material layer 123 is formed by oxidizing the semiconductor substrate 101, so that the first material layer 123 may be formed within the semiconductor substrate 101.

Figure 1H:
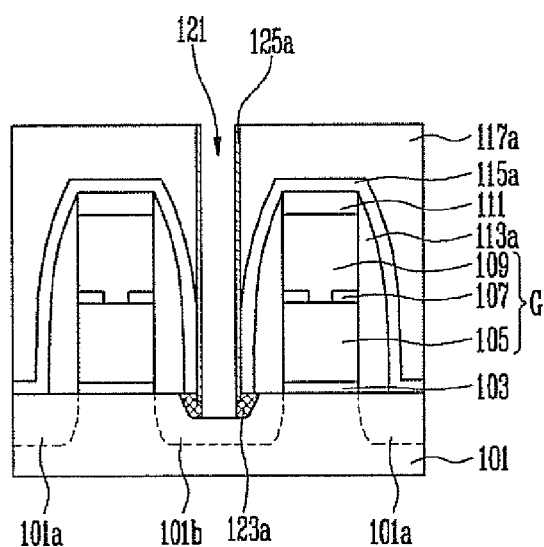

Referring to FIG. 1H, the second material 125 is etched by an etching process, such as an etch-back process. As a result, the second material layer 125, which is formed on a surface of the first material layer 123, at a bottom of the recess region 121, is removed. The second material layer 125 remains on the side walls of the recess region 121, as side wall insulating layers 125a. After the etching process, the first material layer 123 exposed between the side wall insulating layers 125a is partially removed by an etching process to form barrier layers 123a that between the side wall insulating layers 125a and the semiconductor substrate 101. The second junction region 101b of the semiconductor substrate 101 is exposed.

The cleaning process is performed after the etching process of the first and second material layers 123 and 125. Since the side wall insulating layers 125a, which are formed on the side walls of the recess region 121, are formed of the material (e.g., the nitride layer) that does not react to the cleaning solution, the void in the interlayer insulating layer 117a is will not be exposed.

Figure 1I:
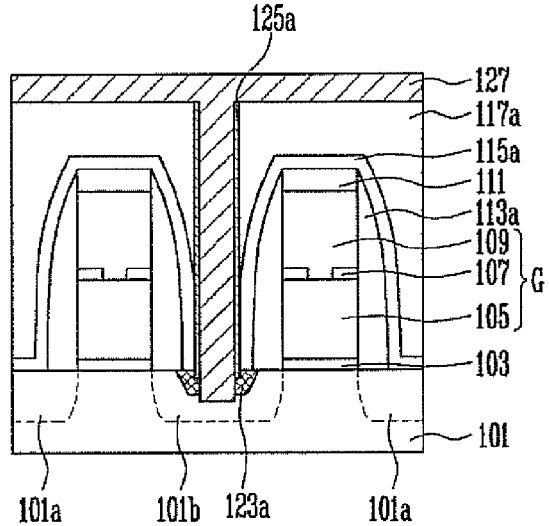

Referring to FIG. 1I, a conductive layer 127 is formed to a thickness sufficient to fill the recess region 121. In this case, even if the void is formed within the interlayer insulating layer 117a, the recess region 121 is isolated from the void by the side wall insulating layers 125a, so that a phenomenon in which the void is filled with the conductive layer 127 may be prevented. Accordingly, the present invention may prevent the defects caused due to the filling of the void with the conductive layer 127.

Figure 1J:
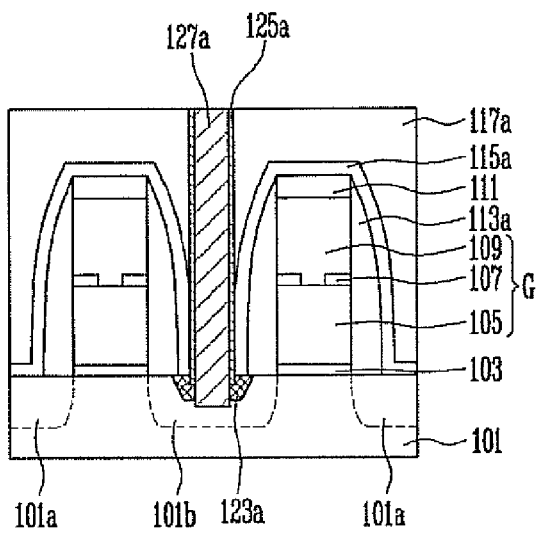

Referring to FIG. 1J, a conductive layer pattern 127a is formed in the recess region 121 by removing the conductive layer 127 on an upper surface of the interlayer insulating layer 117a by a planarization process. The conductive layer pattern 127a may be a contact plug if the recess region 121 has a circular cross section or the conductive layer pattern 127a may be a line pattern if the recess region 121 extends across the substrate 101. The semiconductor device according to the first embodiment of the present invention includes, as illustrated in FIG. 1J, the interlayer insulating layer 117a formed on the semiconductor substrate 101; the conductive layer pattern 127a passing through the interlayer insulating layer 117a and being in contact with the second junction region 101b of the semiconductor substrate 101; the side wall insulating layer 125a formed between the side wall of the conductive layer pattern 127a and the interlayer insulating layer 117a ; and the barrier layer 123a formed in the interface between the semiconductor substrate 101 and the side wall insulating layer 125a.

The side wall insulating layer 125a may be formed of the second material layer 125, which may be a nitride layer that does not react to the cleaning solution. Even though the side wall insulating layer 125a may be formed of the nitride layer, which is capable of charge trapping, the barrier layer 123a, which is formed of the same material as the first material layer 123 is capable of blocking the charges between the side wall insulating layer 125 and the semiconductor substrate 101. Therefore contact between the side wall insulating layer 125a and the semiconductor substrate 101 may be prevented.

An electric field may be concentrated to the lower edge portion of the recess region 121 when driving the semiconductor device. If the side wall insulating layer 125a were to be in contact with the second junction region 101b, then the charges or the impurity from the second junction region 101b may be trapped in the side wall insulating layer 125a, which is formed of the nitride layer capable of charge trapping. In the first embodiment of the present invention, since any contact between the side wall insulating layer 125a and the semiconductor substrate 101 is prevented by the barrier layer 123a, the present invention may prevent the side wall insulating layer 125a from trapping charges due to the concentration of the electric field at the lower edge portion of the recess region 121 and therefore, improve the reliability of the semiconductor device.

Figure 2A:
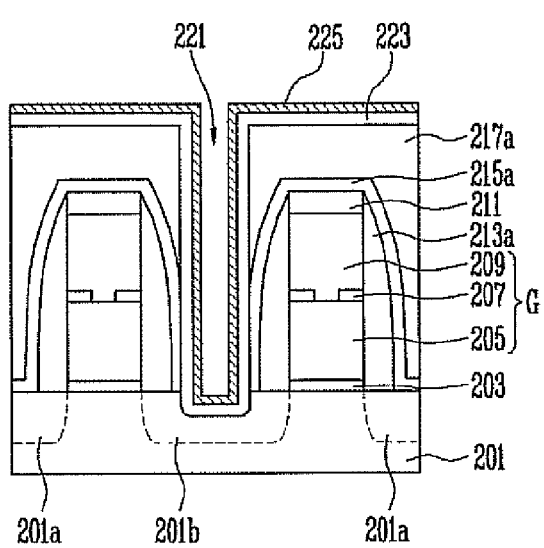
FIGS. 2A to 2C are cross-sectional views illustrating a semiconductor device and a method of manufacturing the semiconductor device according to a second embodiment of the present invention.
Figure 2B:
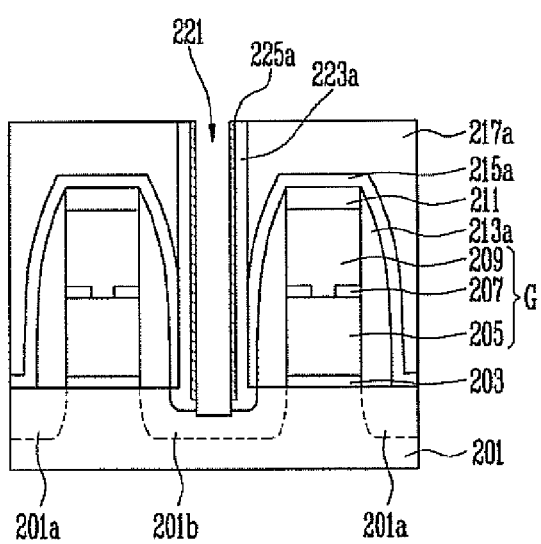
Figure 2C:
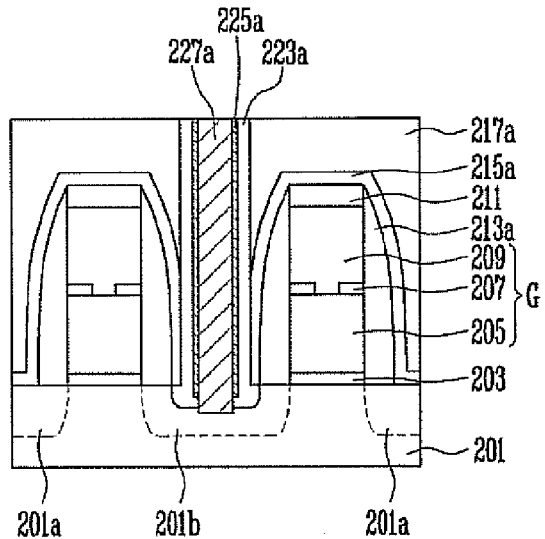

FIGS. 2A to 2C are cross-sectional views illustrating a semiconductor device and a method of manufacturing the semiconductor device according to a second embodiment of the present invention.

Referring to FIG. 2A, in the same manner as described with reference to FIG. 1A, gate patterns G are formed by etching a gate insulating layer 203, a floating gate layer 205, a dielectric layer 207, and a control gate layer 209, stacked on a semiconductor substrate 201, using with hard mask patterns 211 as an etch barrier. Then, in the same manner as that described with reference to FIG. 1A, first junction regions 201a are formed in the semiconductor substrate 201 between the gate patterns G.

Then, in the same manner as described with reference to FIGS. 1B to 1F, spacers 213a, an etching stopping layer 215a, an interlayer insulating layer 217a, and a recess region 221 are formed. Subsequently, a first material layer 223 is formed over a surface of the interlayer insulating layer 217a and over a surface defining the recess region 221.

The first material layer 223 may be formed by depositing an oxide layer using a Low Pressure Chemical Vapor Deposition (LPCVD) method, an Atomic Layer Deposition (ALD) method, or the like.

Then, in the same manner as described with reference to FIG. 1G, an impurity is additionally injected through the recess region 221 with the first material layer 223 serving as a buffer layer to form a second junction region 201b. Subsequently, in the same manner as described with reference to FIG. 1G, a second material layer 225 is formed. In this second embodiment of the present invention, the first material layer 223 may prevent a problem in which the second material layer 225 is in direct contact with the semiconductor substrate 201 at the lower edge portion of the recess region 221.

Referring to FIG. 2B, in a manner similar to that described with reference to FIG. 1H, side wall insulating layers 225a and barrier layers 223a are formed by etching the second material layer 225 and the first material layer 223. In the second embodiment of the present invention, the barrier layers 223a extend along an entire side walls of the recess region 221 and along an entire side walls of the side wall insulating layers 225a. The barrier layers 223a also surround a portion of the side wall insulating layers 225a formed in proximity to the substrate 201, so as to prevent the side wall insulating layers 225a from contacting the substrate 201.

Referring to FIG. 2C, in the same manner as those described with reference to FIGS. 1I and 1J, a conductive layer pattern 227a is formed in the recess region 221.

FIG. 3 is a diagram illustrating a memory system according to an exemplary embodiment of the present invention.

Referring to FIG. 3, a memory system 1100 according to the exemplary embodiment of the present invention includes a nonvolatile memory device 1120 and a memory controller 1110.

The nonvolatile memory device 1120 includes the nonvolatile memory device described in the embodiments described with reference to FIGS. 1a to 2c. Further, the nonvolatile memory device 1120 may include a multi-chip package configured with a plurality of flash memory chips.

The memory controller 1110 is configured so as to control the nonvolatile memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol of a host connected with the memory system 1100. Further, the ECC 1114 detects and corrects an error included in data read from the nonvolatile memory device 1120, and the memory interface 1115 performs interfacing with the nonvolatile memory device 1120. In addition, the memory controller 1110 may further an RCM, etc., for storing code data for interfacing with the host.

As such, the memory system 1100 having the aforementioned construction may be a memory card or a Solid State Disk (SSD) in which the nonvolatile memory device 1120 is combined with the controller 1110. For example, when the memory system 1100 is the SSD, the memory controller 1110 may communicate with the outside (e.g., the host) through one among various interface protocols, such as USB, MMC, PCI-E, SATA, PATA, SCSI, ESDI, and IDE.

According to the exemplary embodiments of the present invention, the barrier layer is formed at the interface between the side wall insulating layer and the semiconductor substrate so as to prevent the side wall insulating layer from being in direct contact with the semiconductor substrate, thereby reducing deterioration of the reliability of the semiconductor device caused by the material included in the side wall insulating layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor device comprising:
    an interlayer insulating layer formed on a semiconductor substrate;
    a conductive layer pattern passing through the interlayer insulating layer to contact the semiconductor substrate;
    a side wall insulating layer covering a surface of the conductive layer pattern; and
    a barrier layer formed at an interface between the semiconductor substrate and the side wall insulating layer.

2. The semiconductor device of claim 1, where the barrier layer is formed in the semiconductor substrate, beneath the side wall insulating layer.

3. The semiconductor device of claim 1, where the barrier layer surrounds a portion of the side wall insulating layer that extends below a surface of the semiconductor substrate.

4. The semiconductor device of claim 1, where the side wall insulating layer is formed of a material having a great etch selectivity to the barrier layer.

5. The semiconductor device of claim 1, where the barrier layer is formed of a material layer capable of blocking a charge.

6. The semiconductor device of claim 1, where the side wall insulating layer is a nitride layer and the barrier layer is an oxide layer.

7. The semiconductor device of claim 1, where the side wall insulating layer is disposed between the conductive layer pattern and the interlayer insulating layer.

8. The semiconductor device of claim 1, further comprising:
    gate patterns, associated with select transistors, formed on the semiconductor substrate, where the conductive layer pattern is interposed between the gate patterns.

9. The semiconductor device of claim 8, where the side wall insulating layer is disposed between the conductive layer pattern and each of the gate patterns associated with the select transistors.

10. The semiconductor device as claimed in claim 1, where the semiconductor substrate includes a first junction region and a second junction region,
    where the second junction is in contact with the conductive layer pattern and has a higher impurity concentration than an impurity concentration of the first junction region.

11. A method of manufacturing a semiconductor device, the method comprising:
    forming an interlayer insulating layer on a semiconductor substrate;
    forming a recess region exposing a surface of the semiconductor substrate by etching the interlayer insulating layer;
    forming a barrier layer covering the exposed surface of the semiconductor substrate;
    forming a side wall insulating layer covering a surface of the recess region including the barrier layer;
    etching the side wall insulating layer and the barrier layer to expose the semiconductor substrate; and
    forming a conductive layer pattern in the recess region, the conductive layer pattern contacting the semiconductor substrate.

12. The method of claim 11, where forming the barrier layer comprises:
    oxidizing the exposed surface of the semiconductor substrate using one of a radical oxidization method, a Rapid Thermal Process (RTP) oxidization method, a wet oxidization method, or a dry oxidization method.

13. The method of claim 11, where forming the barrier layer comprises:
   depositing an oxide layer along a surface of the recess region by Low Pressure Chemical Vapor Deposition (LPCVD) or Atomic Layer Deposition (ALD).

14. The method of claim 11, further comprising:
   injecting an impurity into the semiconductor substrate through the recess region, where the barrier layer serves as a buffer layer.

15. The method of claim 11, further comprising:
   performing a cleaning process, with a cleaning solution, after the etching of the side wall insulating layer and the barrier layer.

16. The method of claim 15, where the side wall insulating layer is formed of a material layer having a great etch selectivity to the cleaning solution.

17. The method of claim 11, where the side wall insulating layer is formed of a material layer having a great etch selectivity to the barrier layer.

18. The method of claim 11, where the barrier layer is formed of a material layer capable of blocking a charge.

19. The method of claim 11, where the side wall insulating layer is formed of a nitride layer and the barrier layer is formed of an oxide layer.

20. The method of claim 11, further comprising:
   forming gate patterns, associated with select transistors, on the semiconductor substrate before forming the interlayer insulating layer.

21. The method of claim 20, where forming the recess region comprises:
   forming the recess region to expose the semiconductor substrate between the gate patterns associated with the select transistors.

* * * * *

UNITED STATES PATENT AND TRADEMARK OFFICE
CERTIFICATE OF CORRECTION

| | | |
|---|---|---|
| PATENT NO. | : 8,772,935 B2 | Page 1 of 1 |
| APPLICATION NO. | : 13/598156 | |
| DATED | : July 8, 2014 | |
| INVENTOR(S) | : Young Ho Yang | |

It is certified that error appears in the above-identified patent and that said Letters Patent is hereby corrected as shown below:

Title page, item should read as follows:

(73)    Assignee:   SK Hynix Inc., Gyeonggi-do (KR)

Signed and Sealed this
Thirtieth Day of September, 2014

Michelle K. Lee
*Deputy Director of the United States Patent and Trademark Office*